(12) United States Patent
Cha et al.

(10) Patent No.: US 8,358,555 B2
(45) Date of Patent: Jan. 22, 2013

(54) FUSE CIRCUIT AND CONTROL METHOD THEREOF

(75) Inventors: Jin Youp Cha, Ichon-shi (KR); Jae Jin Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 217 days.

(21) Appl. No.: 12/835,978

(22) Filed: Jul. 14, 2010

(65) Prior Publication Data
US 2011/0158026 A1 Jun. 30, 2011

(30) Foreign Application Priority Data

Dec. 28, 2009 (KR) .................. 10-2009-0131779

(51) Int. Cl.
*G11C 17/18* (2006.01)
*G11C 17/00* (2006.01)
*H01H 85/00* (2006.01)

(52) U.S. Cl. .................. 365/225.7; 365/96; 327/525

(58) Field of Classification Search ................ 365/225.7
See application file for complete search history.

(56) References Cited

U.S. PATENT DOCUMENTS

| | | | | |
|---|---|---|---|---|
| 5,448,199 | A * | 9/1995 | Park | 327/546 |
| 6,108,246 | A * | 8/2000 | Umezawa et al. | 365/189.09 |
| 6,570,804 | B1 | 5/2003 | Blodgett | |
| 6,950,351 | B2 | 9/2005 | Lim | |
| 6,977,851 | B2 | 12/2005 | Noguchi | |
| 7,397,715 | B2 | 7/2008 | Lim et al. | |
| 7,724,583 | B2 * | 5/2010 | Byeon | 365/189.09 |
| 7,738,310 | B2 * | 6/2010 | Naso et al. | 365/225.7 |
| 8,058,921 | B2 * | 11/2011 | Li et al. | 327/525 |
| 2008/0284486 | A1 * | 11/2008 | Im | 327/333 |

FOREIGN PATENT DOCUMENTS

| | | |
|---|---|---|
| JP | 08-077790 | 3/1996 |
| JP | 2001-035199 A | 2/2001 |
| KR | 1020000003572 A | 1/2000 |
| KR | 1020000045279 A | 7/2000 |
| KR | 1020100063294 A | 6/2010 |

* cited by examiner

*Primary Examiner* — Son Mai
(74) *Attorney, Agent, or Firm* — William Park & Associates Ltd.

(57) ABSTRACT

A fuse circuit includes a plurality of fuse sets configured to perform fuse programming and generate fuse signals in response to fuse programming signals and a fuse control unit configured to generate the fuse programming signals depending upon a level of a programming voltage.

13 Claims, 5 Drawing Sheets

FUSE CIRCUIT AND CONTROL METHOD THEREOF

CROSS-REFERENCES TO RELATED APPLICATION

The present application claims priority under 35 U.S.C. §119(a) to Korean Application No. 10-2009-0131779, filed on Dec. 28, 2009, in the Korean Intellectual Property Office, which is incorporated herein by reference in its entirety as if set forth in full.

BACKGROUND

1. Technical Field

The present invention relates to a semiconductor apparatus, and more particularly, to a fuse circuit of a semiconductor apparatus.

2. Related Art

A semiconductor apparatus comprises various fuse options that can be used to repair defects occurred therein. Using one of the fuse options, a repair memory cell in a semiconductor apparatus such as a memory apparatus can replace a defective memory cell in the semiconductor apparatus in which data is stored.

Various types of fuses are used in fuse circuits, and the fuse circuits may be, for example, fuse options. One type of these fuses is an electrical fuse that may function as an anti-fuse. In general, the electrical fuse refers to a fuse which has high resistance to prevent current flow and is short-circuited when a voltage having a level equal to or higher than a predetermined level is applied to permit current flow. Hence, a fuse circuit comprising the electrical fuse can perform a fuse programming with application of a voltage having a level equal to or higher than the predetermined level, for example, a programming voltage.

FIG. 1 is a block diagram schematically illustrating the configuration of a typical fuse circuit. Referring to FIG. 1, the fuse circuit includes an address input buffer 10, a plurality of fuse sets FS1 through FSn, and a ring counter 20. The address input buffer 10 is configured to generate address signals ADD<1:n> which may represent information on whether to program the fuses provided in the fuse sets FS1 through FSn.

The plurality of fuse sets FS1 through FSn are configured to generate fuse signals FUSEOUT1 through FUSEOUTn in response to the address signals ADD<1:n>, a test mode signal TM, and fuse programming signals Q1 through Qn outputted from the ring counter 20. If some of the fuses are programmed, the corresponding fuse sets among the plurality of fuse sets FS1 through FSn invert the levels of the fuse signals FUSEOUT1 through FUSEOUTn using a programming voltage VPP.

The ring counter 20 is configured to receive a clock signal CLK and a reset signal RST, generate the fuse programming signals Q1 through Qn for actually performing fuse programming, and supply the fuse programming signals Q1 through Qn to the fuse sets FS1 through FSn. Accordingly, if the test mode signal TM is enabled in a test mode, the fuse circuit can program the fuses provided in the fuse sets FS1 through FSn in response to the fuse programming signals Q1 through Qn and the address signals ADD<1:n>.

FIG. 2 is a timing diagram illustrating the operations of the fuse circuit shown in FIG. 1. The operations of the typical fuse circuit will be described below with reference to FIGS. 1 and 2. When the test mode signal TM is enabled in the test mode and the reset signal RST is disabled, the ring counter 20 generates the fuse programming signals Q1 through Qn which are sequentially enabled. The ring counter 20 can comprise flip-flops which are connected in series, in which case it can generate the fuse programming signals Q1 through Qn which are sequentially enabled during their own predetermined intervals as shown in FIG. 2.

If the fuse programming signal Q1 is enabled, the fuse of the fuse set FS1 can be programmed using the programming voltage VPP, and if the fuse programming signal Q2 is enabled, the fuse of the fuse set FS2 can be programmed using the programming voltage VPP. If either of the fuses of the fuse sets FS1 and FS2 is programmed, the level of the corresponding fuse signal FUSEOUT1 or FUSEOUT2 is changed accordingly.

As described above with reference to FIGS. 1 and 2, the fuse programming of the plurality of fuse sets FS1 through FSn can be performed sequentially. However, as the fuse programming is continuously performed and the programming voltage VPP is frequently used, the level of the programming voltage VPP changes. Therefore, a problem of improper programming occurs when fuse programming is performed using a decreased programming voltage VPP by a certain level.

SUMMARY

A fuse circuit for stably performing fuse programming by detecting the level of a programming voltage is described herein.

According to one aspect of the present invention, a fuse circuit comprises a plurality of fuse sets configured to perform fuse programming and generate fuse signals in response to fuse programming signals; and a fuse control unit configured to generate the fuse programming signals depending upon a level of a programming voltage.

According to another aspect of the present invention, a fuse circuit comprises an internal clock generating section configured to detect a level of a programming voltage and generate an internal is clock signal from a clock signal; a fuse programming signal generating section configured to generate fuse programming signals in response to the internal clock signal and a detection signal; and a plurality of fuse sets configured to perform fuse programming and generate fuse signals in response to the fuse programming signals.

According to still another aspect of the present invention, a control method for programming fuses of first and second fuse sets in a semiconductor apparatus using a programming voltage comprises programming the fuse of the first fuse set; detecting a level of the programming voltage; and programming the fuse of the second fuse set depending upon a detected level of the programming voltage.

BRIEF DESCRIPTION OF THE DRAWINGS

Features, aspects, and embodiments are described in conjunction with the attached drawings, in which.

DETAILED DESCRIPTION

Hereinafter, a fuse circuit and a control method thereof according to the present invention will be described with reference to the accompanying drawings through preferred embodiment.

Figure 1:
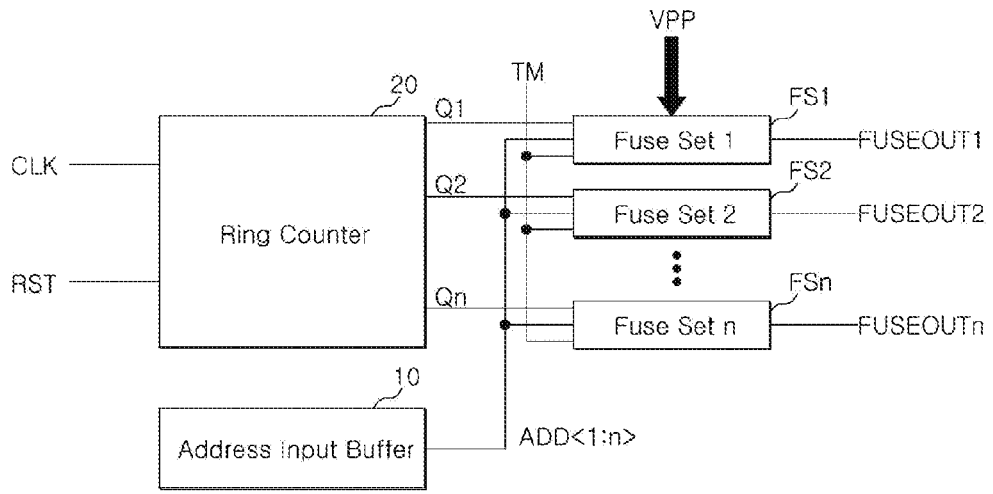
FIG. 1 is a block diagram schematically illustrating the configuration of a typical fuse circuit.
Figure 2:
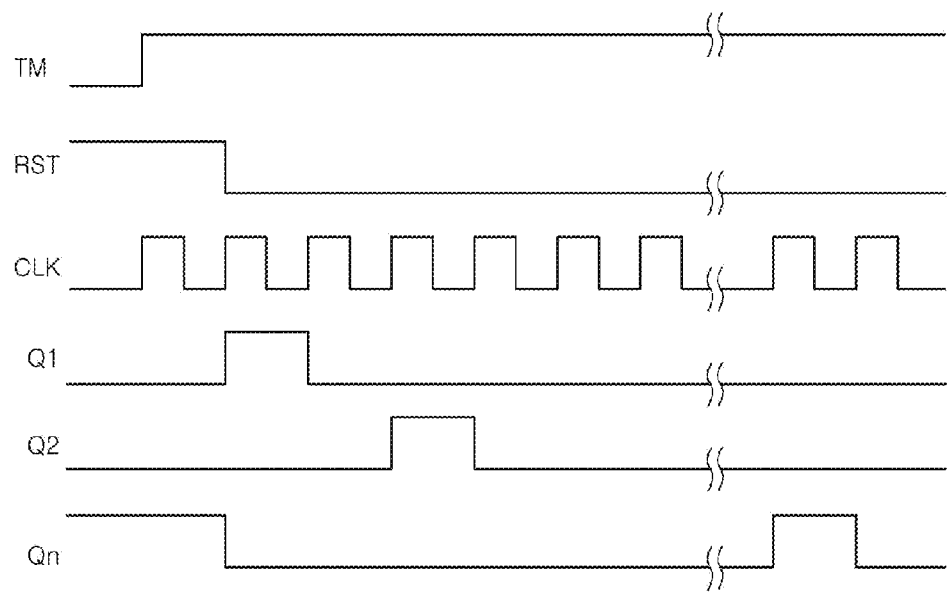
FIG. 2 is a timing diagram illustrating the operations of the fuse circuit shown in FIG. 1.
Figure 3:
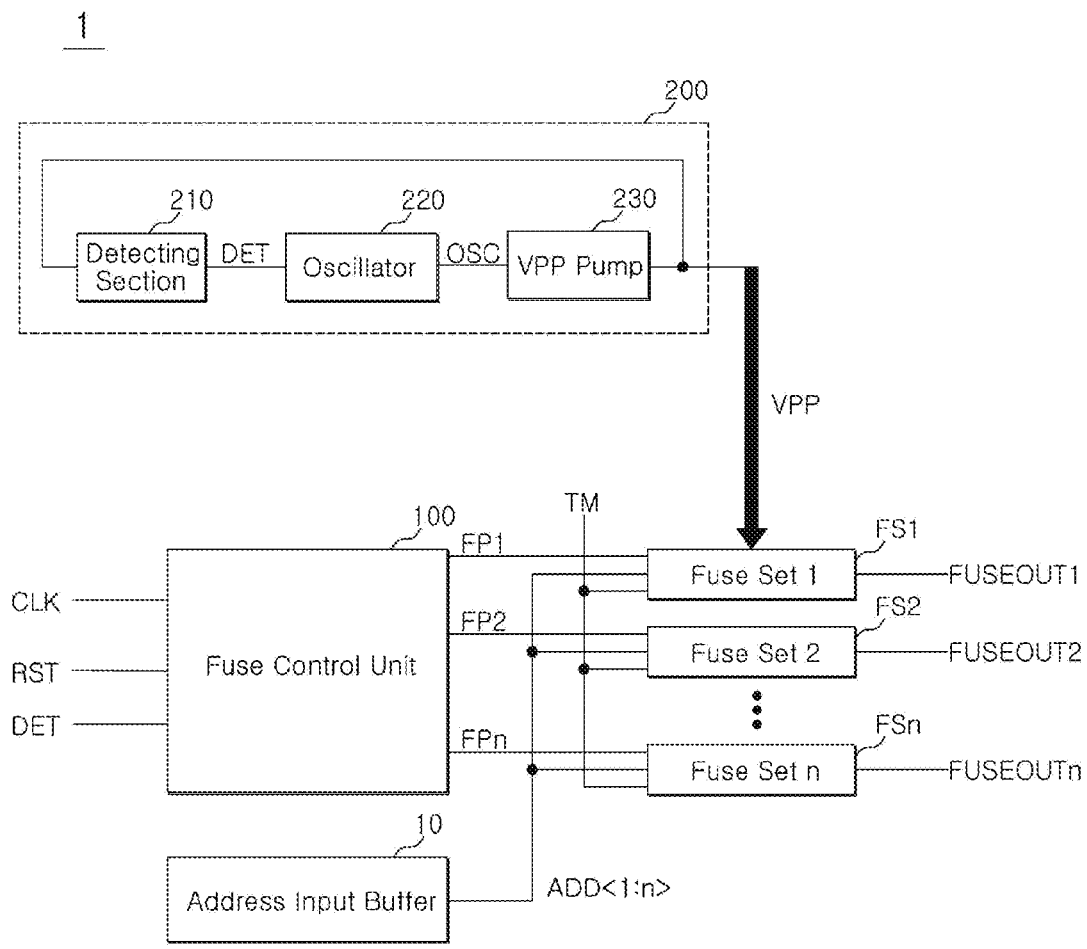
FIG. 3 is a block diagram schematically illustrating the configuration of a fuse circuit in accordance with an embodiment of the present invention.

FIG. 3 is a block diagram schematically illustrating the configuration of a fuse circuit in accordance with an embodiment of the present invention. Referring to FIG. 3, the fuse circuit 1 in accordance with the embodiment of the present invention includes a plurality of fuse sets FS1 through FSn, and a fuse control unit 100. Each of the plurality of fuse sets FS1 through FSn includes one or more fuses. The plurality of fuse sets FS1 through FSn generate fuse signals FUSEOUT1 through FUSEOUTn depending upon whether the fuses are programmed or not. If anti-fuses such as electrical fuses are used as the fuses, the fuse sets FS1 through FSn enable the fuse signals FUSEOUT1 through FUSEOUTn when the fuses are programmed, and disable the fuse signals FUSEOUT1 through FUSEOUTn when the fuses are not programmed. Each of the plurality of fuse sets FS1 through FSn performs fuse programming in response to fuse programming signals FP1 through FPn, respectively.

The fuse control unit 100 is configured to generate the fuse is programming signals FP1 through FPn. The fuse control unit 100 generates the fuse programming signals FP1 through FPn depending upon the level of a programming voltage VPP which is used to program the fuses of the fuse sets FS1 through FSn. The fuse control unit 100 generates the fuse programming signals FP1 through FPn when the level of the programming voltage VPP is equal to or higher than a predetermined level, and does not generate the fuse programming signals FP1 through FPn when the level of the programming voltage VPP is lower than the predetermined level. The fuse control unit 100 receives a detection signal DET and determines whether or not the level of the programming voltage VPP is equal to or higher than the predetermined level. The detection signal DET represents information on the level of the programming voltage VPP, and will be described later in detail.

Still referring to FIG. 3, the fuse control unit 100 is configured to receive a clock signal CLK, a reset signal RST and the detection signal DET, and generates the fuse programming signals FP1 through FPn. In FIG. 3, the fuse control unit 100 generates first through n-th fuse programming signals FP1 through FPn which are to be inputted to first through n-th fuse sets FS1 through FSn, respectively. The fuse control unit 100 generates the fuse programming signals FP1 through FPn in response to the disabled state of the detection signal DET when the programming voltage VPP is equal to or higher than the predetermined level. Conversely, the fuse control unit 100 does not generate the fuse programming signals FP1 through FPn in response to the enabled state of the detection signal DET when the programming voltage VPP is lower than the predetermined level. When the detection signal DET is disabled, the fuse control unit 100 can sequentially generate the first through n-th fuse programming signals FP1 through FPn in response to the clock signal CLK and the reset signal RST.

Referring to FIG. 3, the fuse circuit 1 in accordance with one embodiment of the present invention can further include a programming voltage generation unit 200 configured to generate the programming voltage VPP and the detection signal DET. The programming voltage generation unit 200 supplies the programming voltage VPP to the fuse sets FS1 through FSn. The programming voltage VPP is used to program the fuses of the fuse sets FS1 through FSn. As the programming voltage VPP, a high voltage such as a pumping voltage is usually used to program electrical fuses. However, the present invention is not limited to the use of the high voltage such as the pumping voltage, and it is to be understood that the technical concept of the present invention can be applied without departing from its technical gist even when a lower voltage is used to program the fuses.

In FIG. 3, the programming voltage generation unit 200 includes a detecting section 210, an oscillator 220, and a voltage pump (VPP pump) 230. The detecting section 210 is configured to be fed back with the programming voltage VPP and enables the detection signal DET when the level of the programming voltage VPP is lower than the predetermined level. The oscillator 220 generates an oscillation signal OSC when the detection signal DET is enabled. The voltage pump 230 raises the level of the programming voltage VPP in response to the oscillation signal OSC. If the level of the programming voltage VPP is raised and reaches the predetermined level, the detecting section 210 disables the detection signal DET. Accordingly, the fuse control unit 100 can determine whether or not the level of the programming voltage VPP is equal to or higher than the predetermined level using the detection signal DET which is generated by the detecting section 210 of the programming voltage generation unit 200. It should be understood that any pumping circuit for generating a high voltage may be used as the programming voltage generation unit 200.

In FIG. 3, the fuse circuit 1 in accordance with the embodiment of the present invention can further include an address input buffer 10 which is configured to generate address signals ADD<1:n>. The address signals ADD<1:n> represent information on whether to program the fuses of the fuse sets FS1 through FSn. In other words, the address input buffer 10 receives information on which fuse in the plurality of fuse sets FS1 through FSn is to be programmed, from a user or a controller to which the fuse circuit 1 is connected, and generates the corresponding address signals ADD<1:n>. Therefore, the fuse in the designated fuse set among the plurality of fuse sets FS1 through FSn by the address signals ADD<1:n> can be programmed when the fuse programming signals FP1 through FPn are inputted.

Figure 4:
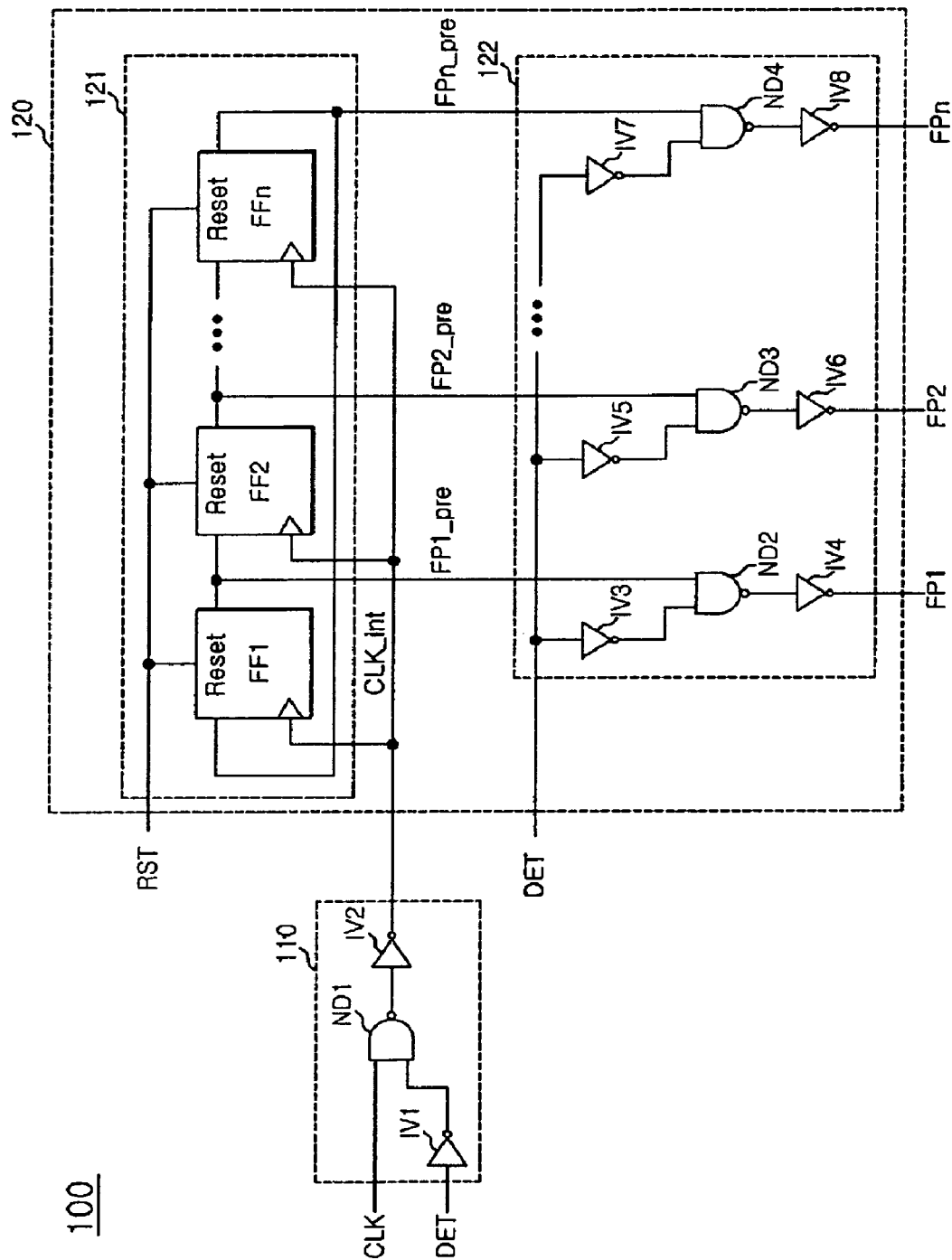
FIG. 4 is a circuit diagram illustrating the configuration of a fuse control unit shown in FIG. 3.

FIG. 4 is a circuit diagram illustrating the configuration of the fuse control unit shown in FIG. 3. Referring to FIG. 4, the fuse control unit 100 includes an internal clock generating section 110 and a fuse programming signal generating section 120. The internal clock generating section 110 is configured to receive the clock signal CLK and the detection signal DET and generate an internal clock signal CLK_int when the detection signal DET is disabled. Thus, the internal clock generating section 110 generates the internal clock signal CLK_int from the clock signal CLK only when the level of the programming voltage VPP is equal to or higher than the predetermined level.

In FIG. 4, the internal clock generating section 110 includes a first inverter IV1, a second inverter IV2, and a first NAND gate ND1. The first inverter IV1 inverts the detection signal DET. The first NAND gate ND1 receives the clock signal CLK and the output of the first inverter IV1. The second inverter IV2 inverts the output of the first NAND gate ND1 and generates the internal clock signal CLK_int. Therefore, the internal clock generating section 110 generates the internal clock signal CLK_int from the clock signal CLK only when the detection signal DET is disabled to a low level.

The fuse programming signal generating section 120 is configured to receive the internal clock signal CLK_int, the reset signal RST and the detection signal DET and generate the fuse programming signals FP1 through FPn.

The fuse programming signal generating section 120 includes a ring counting section 121 and an output element 122. The ring counting element 121 receives the reset signal RST and the internal clock signal CLK_int. When the reset signal RST is inputted, the ring counting element 121 sequentially outputs high level pulse signals FP1_pre through FPn_pre in response to the internal clock signal CLK_int. The ring counting element 121 includes first through n-th flip-flops FF1 through FFn. The first through n-th flip-flops FF1 through FFn are initialized when the reset signal RST becomes enabled. The n-th flip-flop FFn outputs the high level pulse signal FPn_pre when the reset signal RST is inputted. The output FPn_pre of the n-th flip-flop FFn is inputted to the first flip-flop FF1, and when the reset signal RST is disabled, the first flip-flop FF1 outputs the high level pulse signal FP1_pre in synchronization with the internal clock signal CLK_int. The second flip-flop FF2 receives the output FP1_pre of the first flip-flop FF1 and outputs the high level pulse signal FP2_pre in synchronization with the internal clock signal CLK_int. The third through n-th flip-flops FF3 through FFn receive the outputs of the prior flip-flops in a similar manner. Thus, the high level pulse signals FP1_pre through FPn_pre for generating the first through n-th fuse programming signals FP1 through FPn can be sequentially generated.

The first through n-th flip-flops FF1 through FFn do not generate the high level pulse signals FP1_pre through FPn_pre when the internal clock signal CLK_int is not inputted, and output the high is level pulse signals FP1_pre through FPn_pre only when the internal clock signal CLK_int is inputted. For example, when the second flip-flop FF2 receives the output FP1_pre of the first flip-flop FF1 in case the internal clock signal CLK_int is not inputted, the second flip-flop FF2 does not output the high level pulse signal FP2_pre until the internal clock signal CLK_int is inputted. Thereafter, when the internal clock signal CLK_int is inputted to the second flip-flop FF2, the second flip-flop FF2 outputs the high level pulse signal FP2_pre. The third through n-th flip-flops operate in the same manner as the second flip-flop FF2. Accordingly, the high level pulse signals FP1_pre through FPn_pre outputted from the first through n-th flip-flops FF1 through FFn can be sequentially generated.

The output element 122 receives the outputs FP1_pre through FPn_pre of the ring counting element 121 and the detection signal DET, and generates the fuse programming signals FP1 through FPn. The output element 122 includes the same number of NAND gates as the fuse programming signals FP1 through FPn, and twice the number of inverters as the fuse programming signals FP1 through FPn. For example, in FIG. 4, the output element 122 includes second through fourth NAND gates ND2 through ND4, and third through eighth inverters IV3 through IV8. The third, fifth and seventh inverters IV3, IV5 and IV7 invert the detection signal DET. The second NAND gate ND2 receives the output of the third inverter IV3 and the output FP1_pre of the first flip-flop FF1. The fourth inverter IV4 inverts the output of the second NAND gate ND2 and outputs the first fuse programming signal FP1. The third NAND gate ND3 receives the output of the fifth inverter IV5 and the output FP2_pre of the second flip-flop FF2. The sixth inverter IV6 inverts the output of the third NAND gate ND3 and outputs the second fuse programming signal FP2. The fourth NAND gate ND4 receives the output of the seventh inverter IV7 and the output FPn_pre of the n-th flip-flop FFn. The eighth inverter IV8 inverts the output of the fourth NAND gate ND4 and outputs the n-th fuse programming signal FPn. Accordingly, only when the detection signal DET is disabled, the output element 122 can supply the high level pulse signals FP1_pre through FPn_pre generated from the first through n-th flip-flops FF1 through FFn as the fuse programming signals FP1 through FPn.

Figure 5:
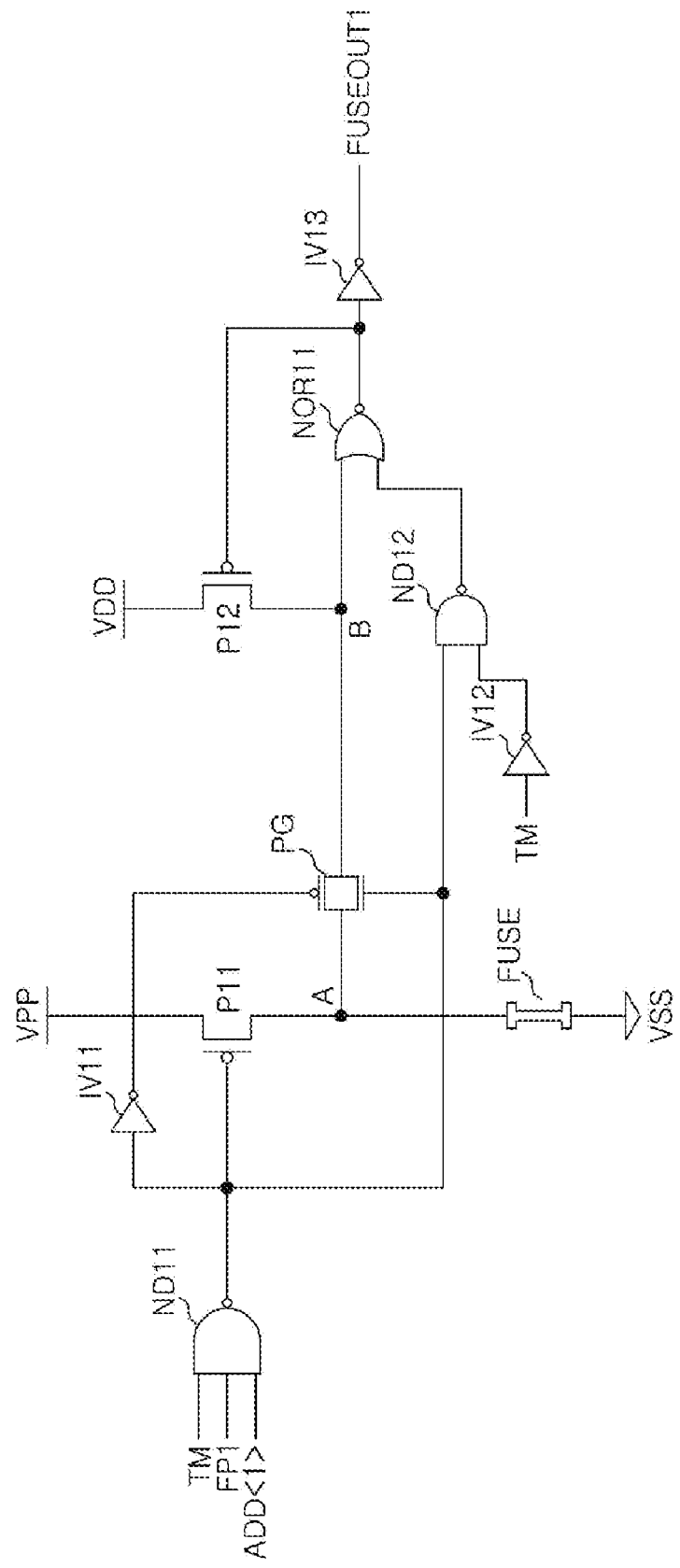
FIG. 5 is a circuit diagram illustrating the configuration of a is fuse set shown in FIG. 3.

FIG. 5 is a circuit diagram illustrating the configuration of a fuse set shown in FIG. 3. FIG. 5 representatively shows the configuration of the first fuse set FS1 among the plurality of fuse sets FS1 through FSn. In FIG. 5, the first fuse set FS1 includes first and second NAND gates ND11 and ND12, first through third inverters IV11 through IV13, a NOR gate NOR11, a pass gate PG, first and second PMOS transistors P11 and P12, and a fuse FUSE. The first NAND gate ND11 receives the test mode signal TM, one of the address signals ADD<1>, and the fuse programming signal FP1. The first PMOS transistor P11 has the gate that receives the output of the first NAND gate ND11, a source to which the programming voltage VPP is applied, and a drain which is connected to a first node A. The fuse FUSE is connected between the first node A and a ground voltage VSS. The pass gate PG is turned on in response to the output of the first NAND gate ND11 and the signal obtained by inverting the output of the first NAND gate ND11 by the first inverter IV11, and connects the first node A to a second node B.

The second inverter IV12 inverts the test mode signal TM, and the second NAND gate ND12 receives the output of the first NAND gate ND11 and the output of the second inverter IV12. The NOR gate NOR11 has one input terminal which is connected to the second node B and the other input terminal which receives the output of the second NAND gate ND12. The third inverter IV13 inverts the output of the NOR gate NOR11 and generates the fuse signal FUSEOUT1 which is disabled to a high level. The second PMOS transistor P12 has a gate that receives the output of the NOR gate NOR11, a source to which a source voltage VDD is applied, and a drain which is connected to the second node B.

Before the fuse FUSE of the first fuse set FS1 is programmed, the second node B is maintained at a high level by the second PMOS transistor P12 and the NOR gate NOR11. When the test mode signal TM, the address signal ADD<1> and the fuse programming signal FP1 are enabled to program the fuse FUSE of the first fuse set FS1, the first NAND gate ND11 outputs a low level signal. Then, the first PMOS transistor P11 is turned on by the low level output of the first NAND gate ND11 and applies the programming voltage VPP to the first node A. At this time, since the pass gate PG is turned off, the programming voltage VPP applied to the first node A is applied to the fuse FUSE, and the fuse FUSE can be programmed. As described above, because the fuse FUSE may comprise an anti-fuse, if the programming voltage VPP is applied, the fuse FUSE is short-circuited and renders the first node A to have the level of the ground voltage VSS.

When the programming of the fuse FUSE is completed and the test mode signal TM is disabled, the output of the first NAND gate ND11 changes to a high level, and the output of the second NAND gate ND12 changes to a high level as well. At this time, the first node A has a low level by the short-circuited fuse FUSE, and the second node B which is connected to the first node A by the turned-on pass gate PG has a low level as well. Therefore, the NOR gate NOR 11 can output a high level signal, and the third inverter IV13 can generate the fuse signal FUSEOUT1 which is enabled to a low level. The second through n-th fuse sets FS2 through FSn have the same configuration as the first fuse set FS1. In this regard, it is to be noted that the configuration of the fuse sets FS1 through FSn is not limited to that shown in FIG. 5 and various circuit configurations capable of similar operation as described above fall under the scope of the present invention.

Figure 6:
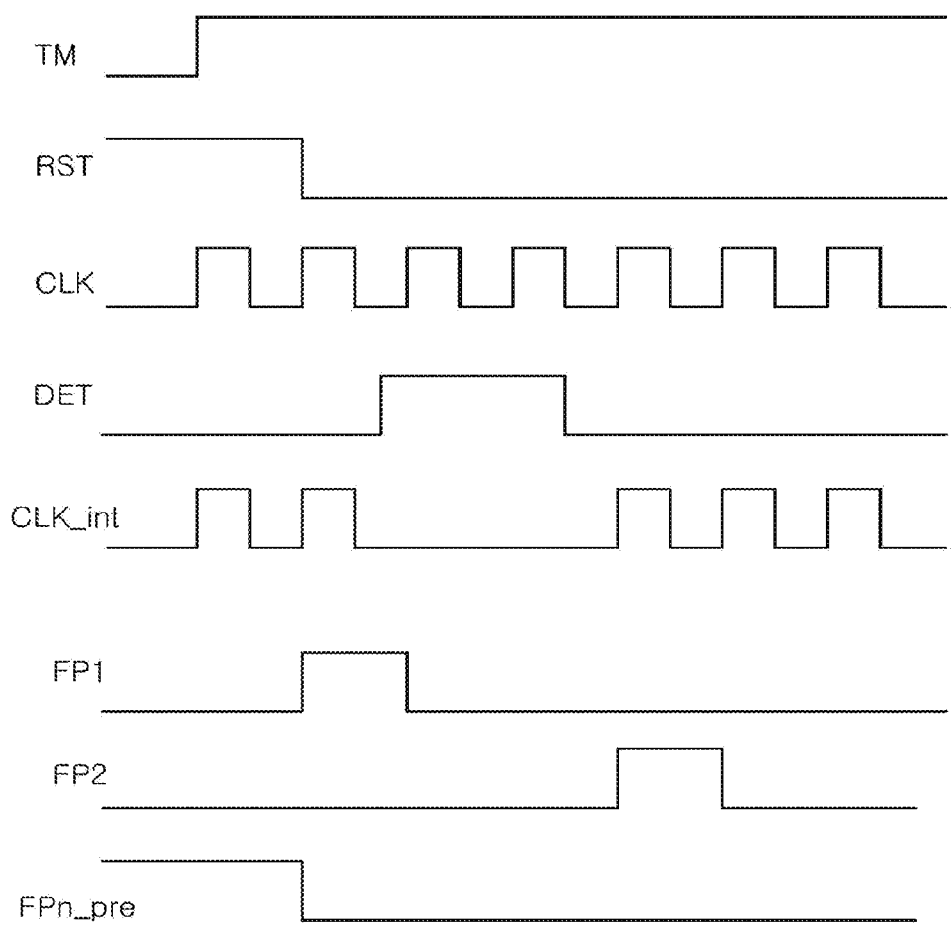
FIG. 6 is a timing diagram explaining the operations of the fuse circuit in accordance with the embodiment of the present invention.

FIG. 6 is a timing diagram explaining the operations of the fuse circuit in accordance with one embodiment of the present invention. Operations of the fuse circuit 1 in accordance with the embodiment of the present invention will be described with reference to FIGS. 3 through 6. The test mode signal TM is enabled to perform the fuse program, and the reset signal RST is disabled to generate the fuse programming signals FP1 through FPn. When the programming voltage VPP has a level equal to or higher than the predetermined level, the detection signal DET is disabled, and the internal clock generating section 110 generates the internal clock signal CLK_int in response to the clock signal CLK and the detection signal DET. The first flip-flop FF1 of the ring counting element 121, which has stored the output FPn_pre of the n-th flip-flop FFn which was generated when the reset signal RST was enabled, outputs the signal FP1_pre, which has a pulse width corresponding to one period of the internal clock signal CLK_int, in synchronization with the internal clock signal CLK_int when the reset signal RST is enabled.

The output element 122 outputs the first fuse programming signal FP1 in response to the disabled detection signal DET. When the first fuse set FS1 receives the first fuse programming signal FP1, the first fuse set FS1 programming the fuse FUSE using the programming voltage VPP. Of course, at this time, in order to allow the fuse FUSE of the first fuse set FS1 to be programmed, the address signal ADD<1> must be applied at a high level.

If the level of the programming voltage VPP is lowered below the predetermined level due to the fuse programming of the first fuse set FS1, the detection signal DET is enabled, and the internal clock generating section 110 interrupts the generation of the internal clock signal CLK_int. Thus, even though the second flip-flop FF2 of the ring counting element 121 receives the output FP1_pre of the first flip-flop FF1, it does not output the high level pulse signal FP2_pre. Thereafter, if the level of the programming voltage VPP is raised to or above the predetermined level by the programming voltage generation unit 200, the detection signal DET is disabled, and the internal clock generating section 110 generates the internal clock signal CLK_int again. Accordingly, the second flip-flop FF2 generates the high level pulse signal FP2_pre in synchronization with the internal clock signal CLK_int, and the output element 122 generates the second fuse programming signal FP2. Therefore, the programming of the fuse of the second fuse set FS2 can be performed. The programming of the third through n-th fuse sets FS3 through FSn can be performed in the same manner.

Afterwards, if the test mode signal TM is disabled, the levels of the fuse signals FUSEOUT1 through FUSEOUTn generated by the fuse sets FS1 through FSn are changed depending upon whether the fuses are programmed or not.

While certain aspects have been described above, it will be understood to those skilled in the art that the embodiment described is by way of example only. Accordingly, the fuse circuit and the control method thereof described herein should not be limited based on the described embodiment. Rather, the fuse circuit and the control method thereof described herein should only be limited in light of the claims that follow when taken in conjunction with the above description and accompanying drawings.

What is claimed is:

1. A fuse circuit comprising:
   a plurality of fuse sets configured to perform fuse programming and generate fuse signals in response to fuse programming signals; and
   a fuse control unit configured to generate the fuse programming signals depending upon a level of a programming voltage.

2. The fuse circuit according to claim 1, wherein the fuse control unit generates the fuse programming signals when the level of the programming voltage is equal to or higher than a predetermined level.

3. The fuse circuit according to claim 1, wherein the fuse control unit comprises:
   an internal clock generating section configured to generate an internal clock signal in response to a clock signal and a detection signal; and
   a fuse programming signal generating section configured to generate the fuse programming signals in response to the internal clock signal and the detection signal.

4. The fuse circuit according to claim 3, wherein the fuse programming signal generating section comprises:
   a ring counting element configured to generate the fuse programming signals in response to the internal clock signal and a reset signal; and
   an output element configured to output the fuse programming signals in response to the detection signal.

5. The fuse circuit according to claim 3, wherein the detection signal has information on the level of the programming voltage.

6. The fuse circuit according to claim 3, further comprising:
   a programming voltage generation unit configured to generate the programming voltage and the detection signal.

7. A fuse circuit comprising:
   an internal clock generating section configured to detect a level of a programming voltage and generate an internal clock signal from a clock signal;
   a fuse programming signal generating section configured to generate fuse programming signals in response to the internal clock signal and a detection signal; and
   a plurality of fuse sets configured to perform fuse programming and generate fuse signals in response to the fuse programming signals.

8. The fuse circuit according to claim 7, wherein internal clock generating section generates the internal clock signal from the clock signal when the level of the programming voltage is equal to or higher than a predetermined level.

9. The fuse circuit according to claim 7, wherein fuse programming signal generating section comprises:
   a ring counting element configured to generate the fuse programming signals in response to the internal clock signal and a reset signal; and
   an output element configured to output the fuse programming signals in response to the detection signal.

10. The fuse circuit according to claim 9, wherein the detection signal has information on the level of the programming voltage.

11. The fuse circuit according to claim 9, further comprising:
   a programming voltage generation unit configured to generate the programming voltage and the detection signal.

12. A control method for programming fuses of first and second fuse sets in a semiconductor apparatus using a programming voltage, comprising:
   programming the fuse of the first fuse set;
   detecting a level of the programming voltage; and
   programming the fuse of the second fuse set depending upon a detected level of the programming voltage.

13. The method according to claim 12, wherein the fuse of the second fuse set is programmed when the level of the programming voltage is equal to or higher than a predetermined level.

* * * * *